United States Patent
Vankayala

(10) Patent No.: US 10,083,723 B1
(45) Date of Patent: Sep. 25, 2018

(54) APPARATUSES AND METHODS FOR SHARING TRANSMISSION VIAS FOR MEMORY DEVICES

(71) Applicant: Micron Technology, Inc., Boise, ID (US)

(72) Inventor: Vijayakrishna J. Vankayala, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/985,118

(22) Filed: May 21, 2018

Related U.S. Application Data

(62) Division of application No. 15/442,501, filed on Feb. 24, 2017, now Pat. No. 10,002,647.

(51) Int. Cl.
*G11C 5/06* (2006.01)
*H01L 25/065* (2006.01)
*G11C 8/10* (2006.01)

(52) U.S. Cl.
CPC .................. *G11C 5/06* (2013.01); *G11C 8/10* (2013.01); *H01L 25/0657* (2013.01); *H01L 2225/06541* (2013.01)

(58) Field of Classification Search
CPC ......... G11C 5/06; G11C 8/10; H01L 25/0657; H01L 2225/06541
USPC ........................................................... 365/63
See application file for complete search history.

(56) References Cited

U.S. PATENT DOCUMENTS

| | | | | |
|---|---|---|---|---|
| 8,896,108 B2* | 11/2014 | Watanabe | ......... | H01L 23/49513 257/491 |
| 9,035,464 B2* | 5/2015 | Li | .......... | H01L 23/481 257/774 |
| 2015/0061148 A1* | 3/2015 | Li | .......... | H01L 23/481 257/774 |
| 2015/0243643 A1* | 8/2015 | Li | .......... | H01L 25/50 438/109 |

\* cited by examiner

*Primary Examiner* — Harry W Byrne
(74) *Attorney, Agent, or Firm* — Dorsey & Whitney LLP

(57) ABSTRACT

Apparatuses and methods for transmitting die state information between a plurality of dies are described. An example apparatus includes: a plurality of dies, wherein each die of the plurality of dies includes a first through electrode and a second through electrode; a first path including the first electrodes of the plurality of dies in series; and a second path including the first electrodes of the plurality of dies in series. The first path transmits first internal state information related to a first state of at least one die of the plurality of dies. The second path transmits second internal state information related to a second state of at least one die of the plurality of dies.

20 Claims, 8 Drawing Sheets

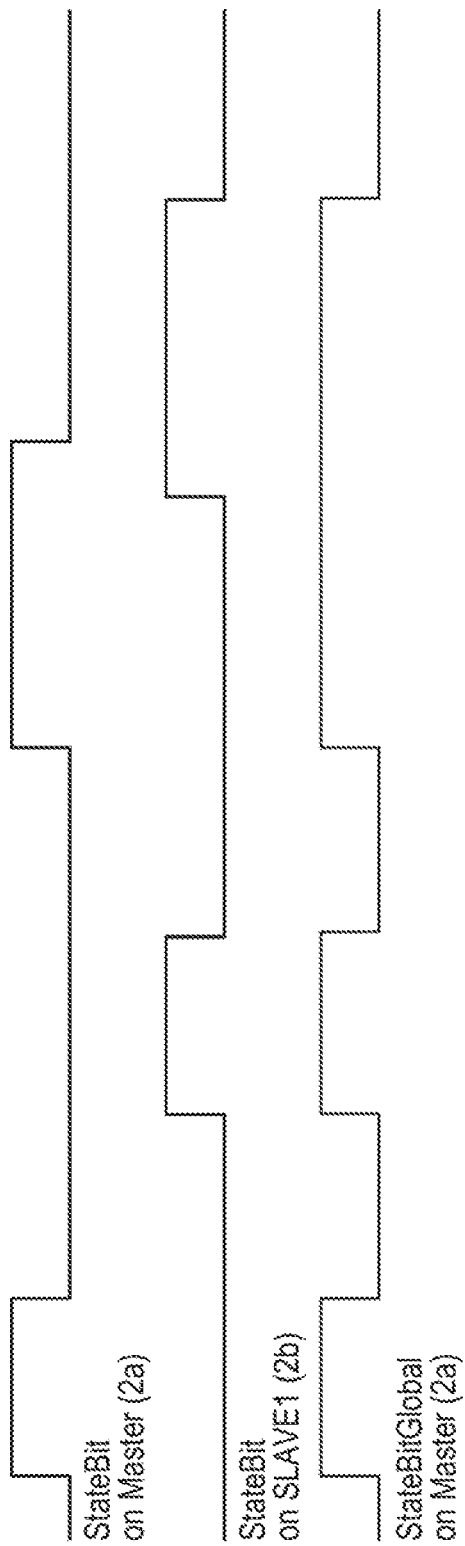

APPARATUSES AND METHODS FOR SHARING TRANSMISSION VIAS FOR MEMORY DEVICES

CROSS-REFERENCE TO RELATED APPLICATIONS(S)

This application is a divisional of U.S. application Ser. No. 15/442,501 filed Feb. 24, 2017, which is incorporated herein by reference, in its entirety, for any purpose.

BACKGROUND

High data reliability, high speed of memory access, lower power consumption and reduced chip size are features that are demanded from semiconductor memory. In recent years, three-dimensional (3D) memory devices by stacking dies vertically and interconnecting the dies using through-silicon vias (TSVs) have been introduced. Benefits of the 3D memory devices include a plurality of dies stacked with a large number of vertical vias between the plurality of dies and memory controller, which allow wide bandwidth buses with high transfer rates between functional blocks in the plurality of dies, and a considerably smaller footprint. Thus, the 3D memory devices contribute to large memory capacity, higher memory access speed and chip size reduction. The 3D memory devices include Hybrid Memory Cube (HMC) and High Bandwidth Memory (HBM).

In the 3D memory devices above, the plurality of dies connected using through silicon vias (TSVs) are in Master-Slave (MS) configuration. A master die (MD) (e.g., an interface die) receives commands and data from a system, and transmits the commands and the data to a destination die. The destination die may be the master die itself or one of a plurality of slave dies (SDs) (e.g., a plurality of core dies) based on a chip identifier indicating the destination die that is received along with the command.

Each die of the master die and the plurality of the slave dies may generate internal state information. For example, the internal state information may indicate an active state of a die when a bank associated with the die is activated and any external load mode register command is configured to be ignored. Another example is when the internal state information may indicate an active state of the die responsive to a command, such as a read command, write command, or auto pre-charge command, associated with the die is issued and the master die needs to keep providing its clock signal regardless of the internal state of the master die. FIG. 1A is a schematic diagram of a conventional semiconductor device including through-silicon vias (TSVs) in a plurality of dies. The conventional semiconductor device 1 may include a plurality of dies 2a to 2h including a master die 2a and seven slave dies 2b to 2h. For example, the number of the plurality of dies in FIG. 1A may be eight, however the number of the plurality of dies is not limited to eight. The internal state information of each die is transmitted to the master die 2a using the TSVs. Each slave die transmits its one bit internal state information, and a plurality of TSVs including one TSV to transmit one bit internal state information for each die (e.g., eight TSV0 of eight dies, . . . , or eight TSV7 of the eight dies) are included in a path.

Each die has a state information transmitter (e.g., a master state information generator 3a, slave state information generators 3b to 3h) that generates a state bit signal (StateBit). FIG. 1B is a conventional state information generator 3 in the semiconductor device 1. The conventional state information generator 3 may be the master state information generator 3a, and/or the slave state information generators 3b to 3h. A NAND circuit receives the active StateBit signal based on a command and an enable signal en and provides a "logic low" signal to a gate of a P-channel field effect transistor to set (e.g., pull up) a first voltage (e.g., a positive power supply) an output signal of the conventional state information generator 3 when a StateBit signal is active, and a NOR circuit receives inactive StateBit signal based on the command and an inverted enable signal enF and provides a "logic high" signal to a gate of an N-channel field effect transistor to set (e.g., pull down) the output signal of the conventional state information generator 3 to a second voltage (e.g., a ground level or a negative power supply voltage). Thus, the conventional state information generator 3 provides the output signal having the logic high level or the logic low level, responsive to an active StateBit signal or the inactive StateBit signal, respectively. Because each die has the conventional state information generator 3 (e.g., a master state information generator 3a, slave state information generators 3b to 3h in FIG. 1B) that generates a StateBit signal indicating its internal state information and a dedicated path to transmit the StateBit signal, a plurality of paths, including a path including a plurality of TSV0s of the plurality of corresponding dies (e.g., "x" representing a number of the plurality of dies), . . . , a path including a plurality of TSVys of the plurality of corresponding dies (e.g., a number "y" representing a number of state bit signals), are included in the conventional semiconductor device 1.

The conventional semiconductor device 1 further includes a global state information generator 4 in the master die 2a. The global state information generator 4 receives the StateBit signals on the eight paths from the dies 2a to 2h and generates a StateBitGlobal signal. FIG. 1C is a timing diagram of signals related to state information of dies of FIG. 1A. For example, the signals may be the StateBit signals of dies 2a and 2b of FIG. 1A. The StateBitGlobal signal is a logical sum of the StateBit signals from the dies 2a and 2b. Thus, the StateBigGlobal signal indicates that at least one die of the plurality of dies is active responsive to any of the StateBit signals from the plurality of dies indicating that a corresponding die is active.

In order to receive the internal state information for each die, a number of TSVs in each path is a number of the state bit signals "y" and a number of paths is a number of the plurality of dies "x". When the number of the plurality of dies "x" increases, the total number of TSVs "x*y" in the semiconductor device increases. If the number of dies increases to 16, 32, . . . , the number of TSVs to be included will be substantially large which prohibits size reduction of the footprint of the semiconductor device.

BRIEF DESCRIPTION OF THE DRAWINGS

FIG. 1C is a timing diagram of signals related to state information of the dies of FIG. 1A.

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
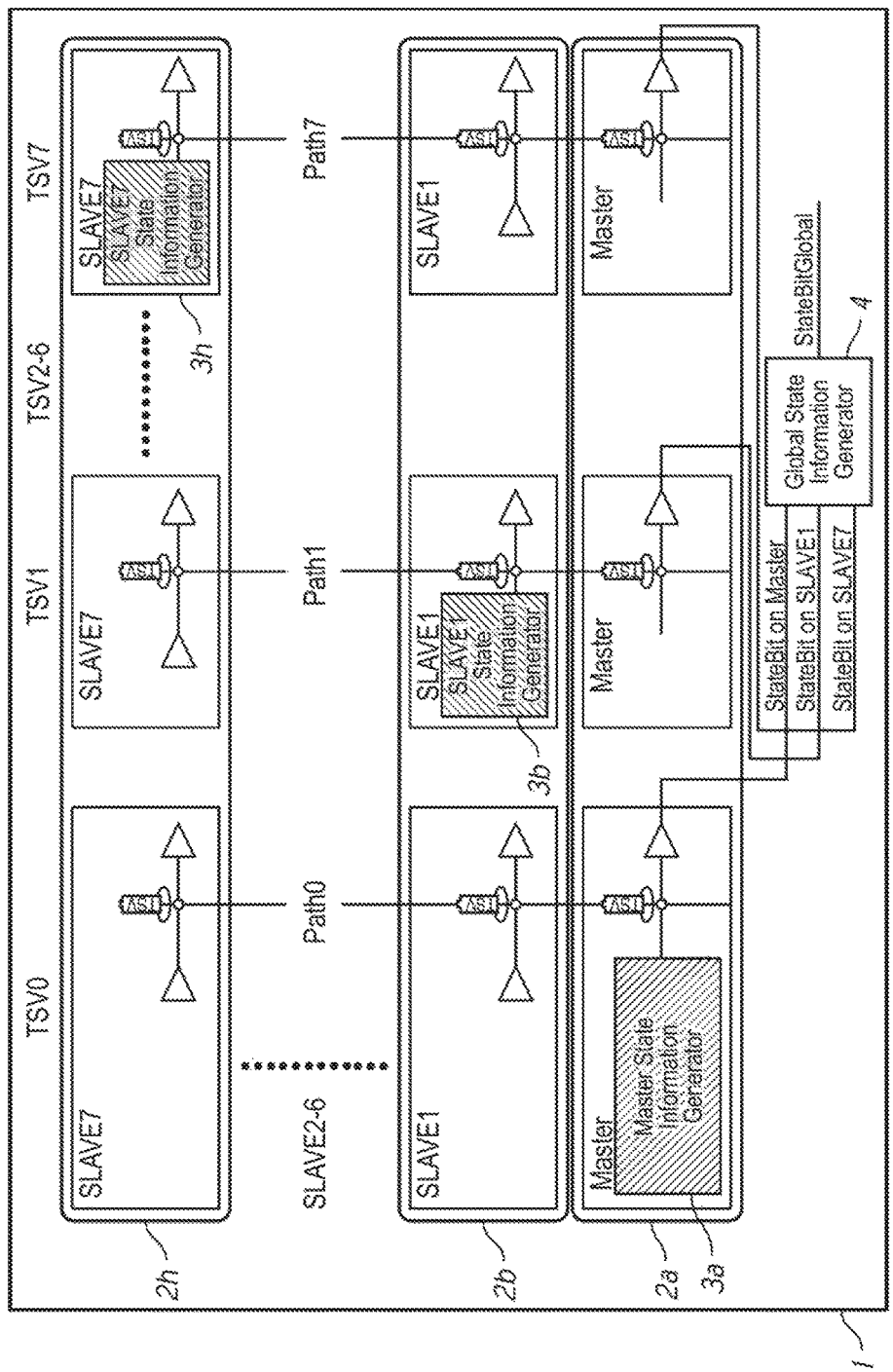
FIG. 1A is a schematic diagram of a conventional semiconductor device including through-silicon vias (TSVs) in a plurality of dies.
Figure 1B:
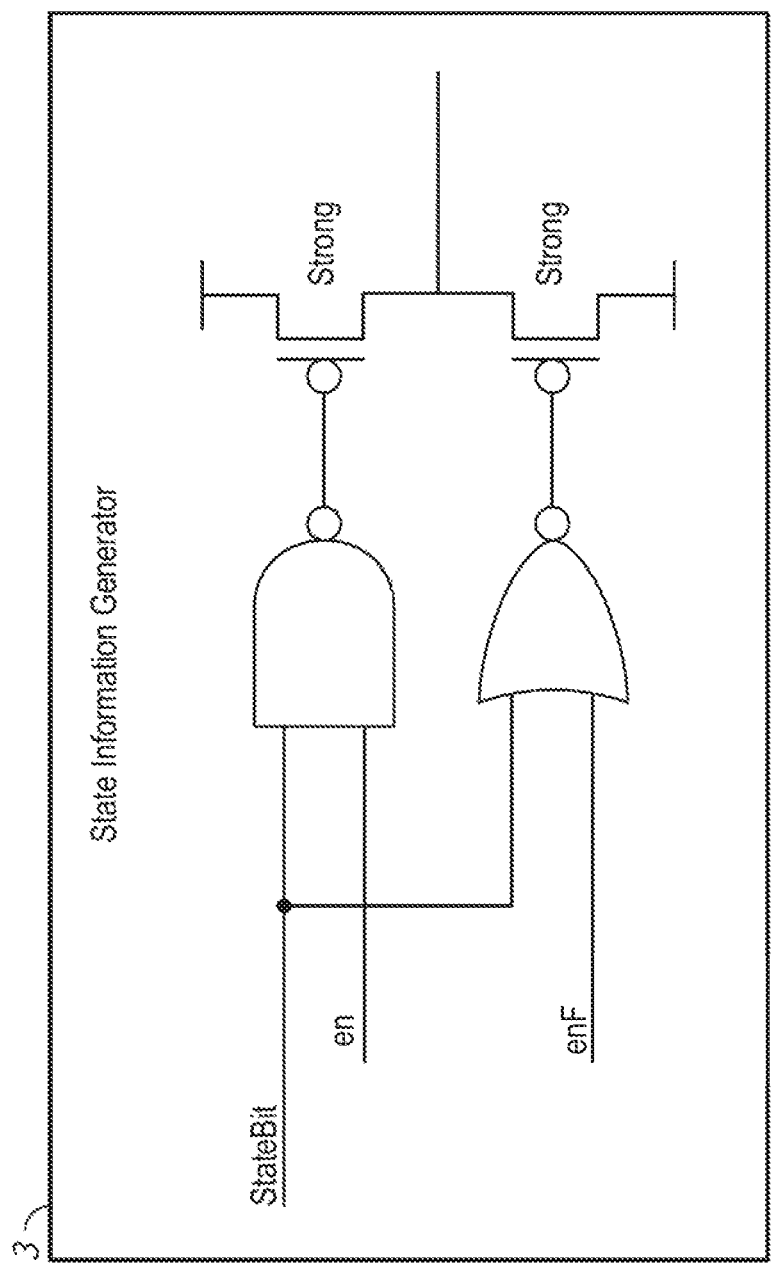
FIG. 1B is a conventional state information transmitter in the semiconductor device.
Figure 2:
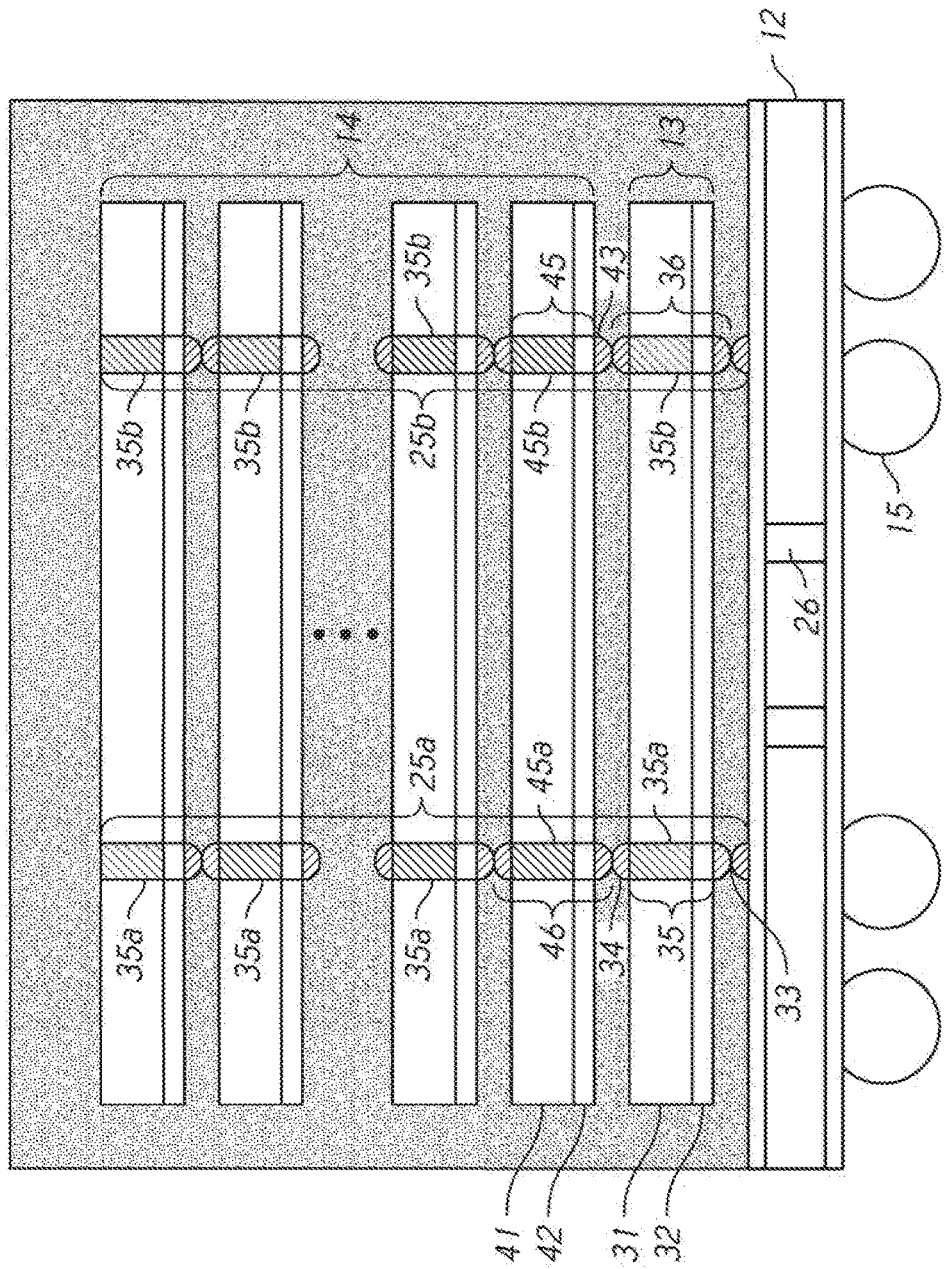
FIG. 2 is a schematic diagram of a semiconductor device including a plurality of dies in accordance with an embodiment of the present disclosure.

FIG. 2 is a schematic diagram of a semiconductor device including a plurality of dies in accordance with an embodiment of the present disclosure. As shown in FIG. 2, the semiconductor device 10 may include the plurality of dies stacked on each other. For example, the plurality of dies may include a master die 13 and a plurality of slave dies 14 stacked on the master die 13. Please note that the master die 13 and the plurality of slave dies 14 may be physically identical dies and the master die 13 may be configured to function as the master die 13 and the plurality of slave dies 14 may be configured to function as the slave dies 14. Each of the master die 13 and the slave dies may be assigned a unique identifier (e.g., stack ID). The master die 13 may be stacked on a substrate 12. The semiconductor device 10 may include one or more external terminals IS (e.g., one or more pads) which may receive external signals and provide the external signals to internal signal wirings 26 of the substrate 12.

The master die 13 may include a substrate layer 31 and a wiring layer 32. The master die 13 includes a plurality of through wirings 36. For example, each of the plurality of through wirings 36 may include a through electrode (TSV) 35 in the substrate layer 31. For example, each of the plurality of through wirings 36 may include a substrate terminal 33 on a side of the substrate 12 that couples the substrate 12 to the TSV 35. The master die 13 may include an external input/output circuit (not shown) that is coupled to a plurality of substrate terminals 33. The external input/output circuit transmits signals from/to the outside of the semiconductor device 10 through the substrate 12. For example, each of the plurality of through wirings 36 may include a terminal 34 (e.g., surface bump) on a side of the plurality of slave dies 14 which couples the TSV 35 to a corresponding terminal 43 of one of the plurality of slave dies 14 facing the master die 13. The master die 13 may also include an internal signal input/output circuit (not shown) that is coupled to a plurality of terminals 34. The internal signal input/output circuit transmits data to/from the slave dies 14.

Each of the plurality of slave dies 14 may include a substrate layer 41 and a wiring layer 42. Each of the plurality of slave dies 14 may include a large number of memory cells (not shown, e.g., dynamic random access memory). Each of the plurality of slave dies 4 may include memory cell peripheral circuits (not shown, e.g., sense amplifiers and address decoders), timing control circuits for adjusting operation timings of the memory cell peripheral circuits, input/output circuits relative to the master die 13, test circuits for defect detection in a wafer test for slave dies. Each of the plurality of slave dies 14 may include a plurality of through wirings 46. Each of the plurality of through wirings 46 may include one or more terminals 43 and a plurality of through electrodes (TSVs) 45.

The semiconductor device 10 of FIG. 2 includes an active state information path 25a and an inactive state information path 25b. The active state information path 25a, including TSVs 35a and 45a of the plurality of dies 13 and 14 in series, may transmit active internal state information responsive to an active state of one die of the plurality of dies 13 and 14. The inactive state information path 25b, including TSVs 35b and 45b of the plurality of dies 13 and 14 in series, may transmit inactive internal state information transitions. For example, the inactive internal state information may be represented by a one shot pulse signal responsive to the transition of one die of the plurality of dies 13 and 14 from the active state to the inactive state. The details of the active state information path 25a and the inactive state information path 25b are described later.

Figure 3:
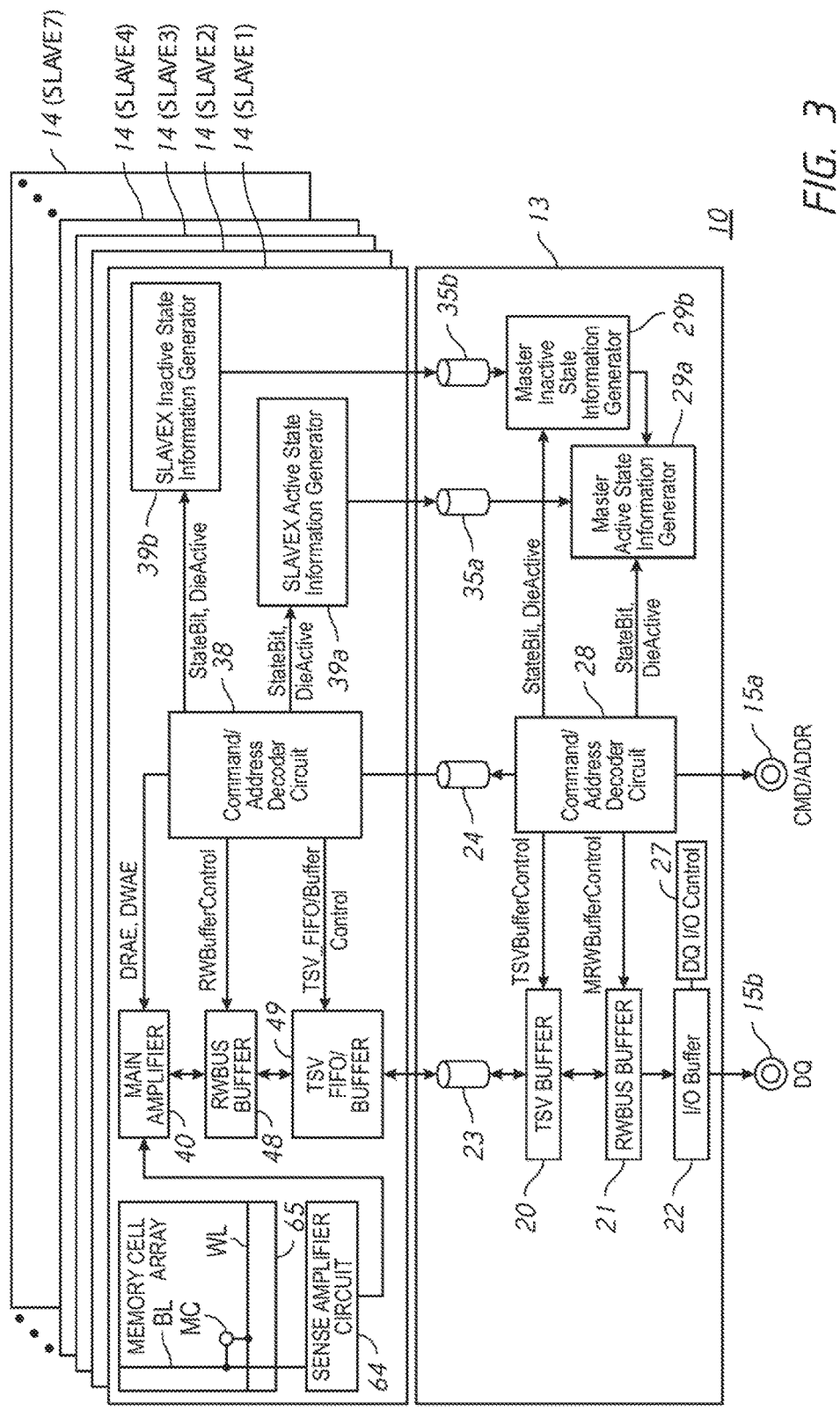
FIG. 3 is a block diagram of a semiconductor device including a plurality of dies in accordance with an embodiment of the present disclosure.

FIG. 3 is a block diagram of a semiconductor device 10 including a plurality of dies 13 and 14 in accordance with an embodiment of the present disclosure. The semiconductor device 10 may include the external terminals 15. For example, the external terminals 15 may include a command/address terminal (CMD/ADDR) 15a and data input/output terminals (DQ) 15b that is a terminal for inputting and outputting of read data or write data. Other terminals, such as clock terminals, address terminals, data strobe terminals, calibration terminals, and power-supply terminals, may also be provided, but are not shown in FIG. 3.

The command/address terminal 15a may receive command and address signals. For example, the command and address signals may include a clock enable signal, row signals and column signals. For example, the row signals may include a bank address, a stack ID that may function as a portion of the bank address, a row address, and one of row commands, such as activate, precharge, refresh, power down entry, self refresh entry, etc. For example, the column signals may include the bank address, the stack ID, a column address, and one of column commands, such as read, read with auto precharge, write, write with precharge, and mode register set (MRS). The command and address signals may be provided to a command/address decoder circuit 28 in the master die 13, and the command/address decoder circuit 28 may transmit the command and address signal to a command/address decoder circuit 38 included in each slave die 14 (e.g., slave 1, slave 2, slave 3, . . . , slave 7) by way of a through electrode 24. The command/address decoder circuits 28 and 38 may provide various internal commands by decoding the command and address signals from the command/address terminal 15a. For example, the command/address decoder circuits 28 and 38 each generates an internal read command, when the command signal indicates a read command. For example, the command/address decoder circuit 28 in the master die 13 may provide control signals MRWBufferControl and TSVBufferControl, based on the internal read command, to a read/write bus buffer 21 and a TSV buffer 20 in the master die 13, respectively. For example, the command/address decoder circuit 38 in each slave die 14 may provide control signals DRAE, RWBufferControl and TSV_FIFO/BufferControl, based on the internal read command, to a main amplifier 40, a read/write bus buffer 48 and a TSV FIFO/buffer 49 in the slave die 14, respectively. For example, the command/address decoder circuits 28 and 38 each generates an internal write command, when the command signal indicates a write command. For example, the command/address decoder circuit 28 in the master die 13 may provide control signals MRWBufferControl and TSVBufferControl, based on the internal write command, to the read/write bus buffer 21 and the TSV buffer 20 in the master die 13, respectively. For example, the command/address decoder circuit 38 in each slave die 14 may provide control signals DWAE, RWBufferControl and TSV_FIFO/BufferControl, based on the internal write command, to the main amplifier 40, the read/write bus buffer 48 and the TSV FIFO/buffer 49 in the slave die 14, respectively.

The master die 13 may include the TSV buffer 20, the RWBUS buffer 21, and the input/output buffer 22 for read and write operations. Each slave die 14 may include the main amplifier 40, the RWBUS buffer 48 and the TSV FIFO/buffer 49 for the read and write operations. For example, each slave die 14 may include a sense amplifier circuit 64 and a memory cell array 65. The master die 13 may include a sense amplifier circuit and a memory cell array (not shown in FIG. 3). Each slave die 14 may include a memory cell array 65 that includes a plurality of word lines WL and a plurality of bit lines BL that intersects each other. Memory cells MC are disposed at intersections of the plurality of word lines WL and the plurality of bit lines BL. One of the plurality of word lines WL may be selected based on the row address included in the command/address signals. The bit lines BL may be coupled to corresponding sense amplifiers in the sense amplifier circuit 64. One of the sense amplifiers may be selected based on the column address included in the command/address signals.

In the read operation, the read data from the memory cell array 65 may be transmitted through the main amplifier 40 and the RWBUS buffer 48 and provided to the TSV FIFO/Buffer 49. For example, the operation timings of the main amplifier 40 and the RWBUS buffer 41 may be controlled by the control signals DRAE and RWBufferControl, respectively, from the command/address decoder circuit 38, based on the internal read command. The TSV FIFO/buffer 49 is so configured as to capture and transmit the read data from the RWBUS buffer 48 to a through electrode 23 in the master die 13, responsive to the control signal TSV_FIFO/BufferControl is activated, based on the internal read command of the command/address decoder circuit 38. The read data from the TSV FIFO/buffer 49 transmitted through the through electrode 23 may be captured by the TSV buffer 20. Then, the read data may be transmitted through the RWBUS buffer 21 and the input/output buffer 22, which may be controlled by a DQ I/O control circuit 27, before being output from the data input/output terminals 15*b* that are coupled to the input/output buffer 22. The operation timings of the TSV buffer 20 and the RWBUS buffer 21 may be controlled by the control signals TSVBufferControl and MRWBufferControl, respectively provided by the command/address decoder circuit 28.

In the write operation, the write data in a number of bits may be received at the data input/output terminals 15*b*. The input/output buffer 22 may convert the write data received in a serial format into a parallel format and then may provide the write data in the parallel format to the RWBUS buffer 21. Then, the RWBUS buffer 21 may provide the write data to the TSV buffer 20. The TSV buffer may transmit the write data through the through electrode 24 to each slave die 14. The operation timing of the input/output buffer 22 may be controlled by a timing signal from the I/O control circuit 27. The operation timings of the RWBUS buffer 21 and the TSV buffer 20 may be controlled by the control signals MRWBufferControl and TSVBufferControl, respectively. The TSVFIFO/Buffer 49 may be coupled to the through electrode 23. The TSVFIFO/Buffer 49 may receive the write data from the through electrode 23 responsive to the control signal TSV_FIFO/Buffer Control based on the internal write command in the command/address decoder circuit 38. The TSVFIFO/Buffer 49 may provide the write data to the memory cell array 65 via the RWBUS buffer 48, the main amplifier 40, and the sense amplifier circuit 64. For example, the operation timings of the main amplifier 40 and the RWBUS buffer 41 may be controlled by the control signals DWAE and RWBufferControl respectively from the command/address decoder circuit 38, based on the internal write command.

The command/address decoder circuits 28 and 38 may generate a state bit (StateBit) signal and an active die identifier signal DieActive to manage states of the plurality of dies 13 and 14. For example, the command/address decoder circuits 28 and 38 may activate the state bit (StateBit) signal based on the command signal, which may indicate whether the command is associated to an active state of any die. For example, the command may be indicative of activation of a bank and a bank address is an identifier of a bank included in a die. For example, the command may be a read command, write command, or auto pre-charge command. For these commands, the master die 13 may keep providing a clock signal regardless of the internal state (active or inactive) of the master die 13. For example, the command/address decoder circuits 28 and 38 may activate the active die identifier signal DieActive for a die that includes a bank identified by the bank address in the command and address signals.

The master die 13 and the slave dies 14, each includes an active state information generator and an inactive state information generator. For example, the master die 13 may include a master active state information generator 29*a* and a master inactive state information generator 29*b*. For example, each of the slave dies 14 may include a slave active state information generator 39*a* and a slave inactive state information generator 39*b*. The slave active state information generator 39*a* of each slave die 14 may be coupled to the master active state information generator 29*a* via one or more through electrodes 35*a* and 25*a*. The slave inactive state information generator 39*b* of each slave die 14 may be coupled to the master inactive state information generator 29*b* via one or more through electrodes 35*b*. The slave active state information generator 39*a* may provide an active signal to transmit active internal state information responsive to an active state of a state bit, and a slave inactive state information generator 39*b* may provide an active signal for a predetermined period (e.g., represented by one shot pulse signal) to transmit inactive internal state information responsive to a transition of the state bit from an active state to an inactive state. The master inactive state information generator 29*b* may have a similar functionality as the slave inactive state information generator 39b. In addition to a similar functionality as the slave active state information generator 39a, the master active state information generator 29a may have a functionality of merging output signals of the slave active state information generators 39a, the slave inactive state information generators 39b and the master inactive state information generator 29b to provide a global state bit signal StateBitGlobal. The details of the active state information generators and the inactive state information generators may be described later.

Figure 4A:
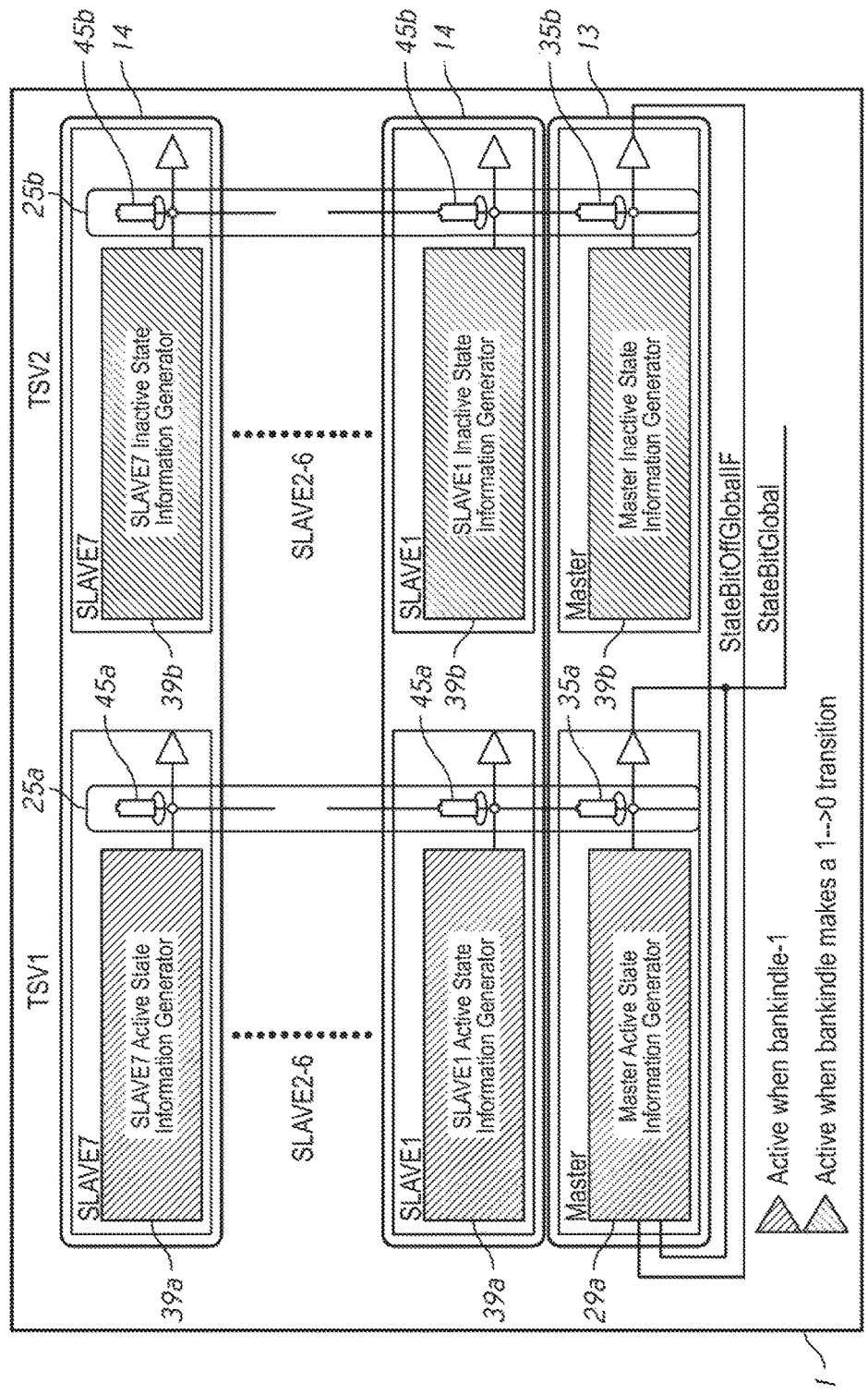
FIG. 4A is a block diagram of the plurality of dies, each including an active state information generator and an inactive state information generator, in accordance with an embodiment of the present disclosure.

FIG. 4A is a block diagram of the plurality of dies, each including an active state information generator and an inactive state information generator, in accordance with an embodiment of the present disclosure. For example, the plurality of dies may a master die 13 and a plurality of slave dies 14 stacked on the master die 13. Please note that the master die 13 and the plurality of slave dies 14 may be physically identical dies and the master die 13 may be configured to function as the master die 13 and the plurality of slave dies 14 may be configured to function as the slave dies 14. Across the master die 13 and the plurality of slave dies 14, an active state information path 25a and an inactive state information path 25b may be provided. For example, each slave die 14 may include a through electrode TSV 45a in the active state information path 25a and a through electrode TSV 45b in the inactive state information path 25b. For example, the master die 13 may include a through electrode TSV 35a in the active state information path 25a and a through electrode TSV 35b in the inactive state information path 25b. The through electrodes TSVs 35a and 45a may be coupled by terminals 34 and 43 as shown in FIG. 2 and the through electrodes TSVs 35b and 45b may be coupled by terminals 34 and 43 as shown in FIG. 2.

In each of the slave die 14, the slave active state information generator 39a is coupled to the active state information path 25a. As described earlier, the slave active state information generator 39a may provide an active output signal, responsive to an active state of each of the slave die 14 based on the internal command, and a slave inactive state information generator 39b may provide an active signal (e.g., one negative shot pulse signal) for a predetermined period responsive to a transition of the state bit from the active state to an inactive state.

Figure 4B:
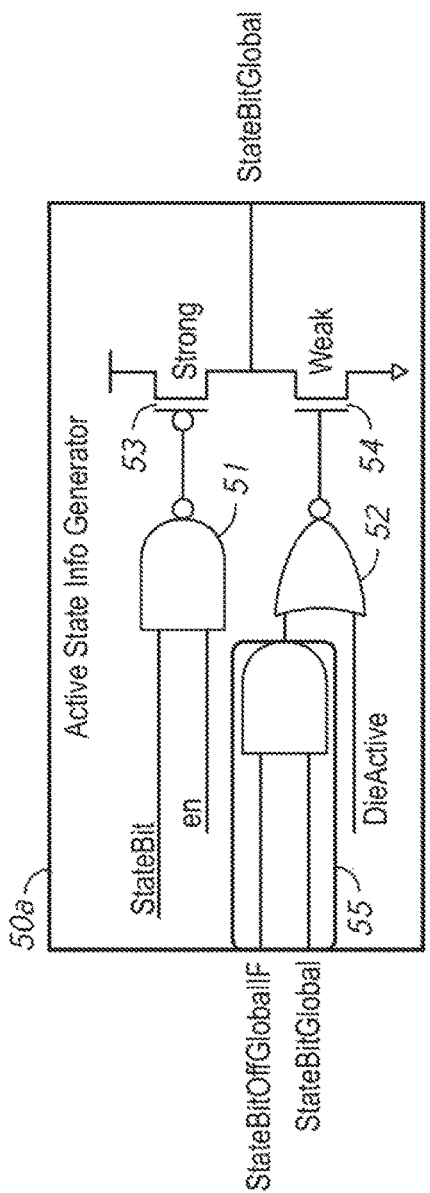
FIG. 4B is a circuit diagram of the active state information generator in the plurality of dies, in accordance with an embodiment of the present disclosure.

FIG. 4B is a circuit diagram of an active state information generator 50a in the plurality of dies, in accordance with an embodiment of the present disclosure. For example, the slave active state information generator 39a may be the active state information generator 50a. The active state information generator 50a may include a NAND circuit 51 that may receive a StateBit signal based on the internal command and an enable signal (en) based on a state of the semiconductor device 10 including the master die 13. Responsive of the StateBit signal being active and the active enable signal (en), a "logic low" signal may be provided to a gate of a transistor 53 of a first type (e.g., P-channel field effect) that has a strong driving ability to set (e.g., pull up) a StateBitGlobal node of the active state information generator 50a on the active state information path 25a to the first voltage when the StateBit signal is active. The active state information generator 50a may include a NOR circuit 52 that may receive an active die identifier signal DieActive. The active state information generator 50a in the slave 14, as the active state information generator 39a, may have an AND circuit 55 configured to be disabled, and the NOR circuit 52 functions as an inverter that may receive the DieActive signal and may further provide an inverted signal of the DieActive signal to a gate of a transistor 54 of a second type (e.g., N-channel field effect) that has a weak driving ability to set (e.g., pull down) the StateBitGlobal node of the active state information generator 50a to the second voltage on the active state information path 25a. Thus, an active (e.g., a logic high level) signal may be provided to the gate of the transistor 54 to weakly set (e.g., pull down) the StateBitGlobal node to the second voltage, responsive to the inactive (e.g., a logic low level) DieActive signal.

Figure 4C:
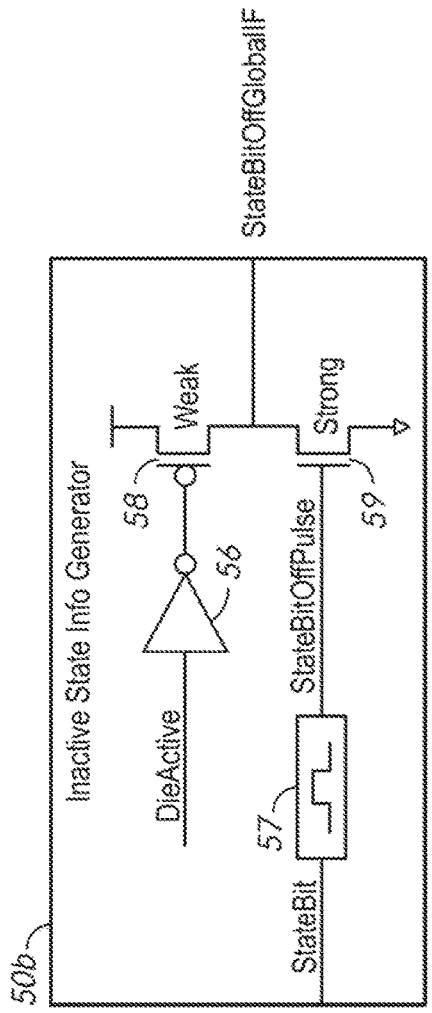
FIG. 4C is a circuit diagram of the active state information generator in the plurality of dies, in accordance with an embodiment of the present disclosure.

FIG. 4C is a circuit diagram of an inactive state information generator 50b in the plurality of dies, in accordance with an embodiment of the present disclosure. For example, the slave inactive state information generator 39b may be the inactive state information generator 50b. The inactive state information generator 50b may include an inverter 56 that may receive the DieActive signal and may further provide an inverted signal of the DieActive signal to a gate of a transistor 58 of a first type (e.g., P-channel field effect) that has a weak driving ability to set (e.g., pull up) a StateBitOffGlobalIF node of the inactive state information generator 50b on the inactive state information path 25b to the first voltage, when the DieActive signal is active. The inactive state information generator 50b may include a one shot pulse generator 57 that may receive the StateBit signal and may further provide a one shot positive pulse as a StateBitOffPulse signal responsive to a transition of the StateBit signal from an active state (e.g., a logic high level) to an inactive state (e.g., a logic low level). The one shot pulse generator 57 may provide the StateBitOffPulse signal to a gate of a transistor 59 of a second type (e.g., N-channel field effect) that has a strong driving ability to set (e.g., pull down) the StateBitOffGlobalIF node of the inactive state information generator 50b to the second voltage on the inactive state information path 25b to the second voltage. Thus, the positive one shot pulse signal may be provided to the gate of the transistor 59 to strongly pull down the StateBitOffGlobalIF node to the second voltage, responsive to the transition (e.g., from the logic high level to the logic low level) StateBit signal to cause a negative one shot pulse signal on the StateBitOffGlobalIF node.

In the master die 13, the master active state information generator 29a is coupled to the active state information path 25a. As earlier mentioned, the master active state information generator 29a may provide an active output signal, responsive to an active state of the master die 13, and further has a functionality of merging output signals of the slave active state information generators 39a, the slave inactive state information generators 39b and the master inactive state information generator 29b to provide a global state bit signal StateBitGlobal. The master inactive state information generator 29b may provide an active signal (e.g., one negative shot pulse signal) for a predetermined period responsive to a transition of the state bit from the active state to an inactive state.

For example, the master active state information generator 29a may be the active state information generator 50a. The description of the NAND circuit 51 will not be repeated. The active state information generator 50a in the master die 13, as the active state information generator 29a, may have the AND circuit 55 configured to be enabled. The AND circuit 55 may include a plurality of input nodes. One input node of the plurality of input nodes may be coupled to the StateBItGlobal node on the active state information path 25a and configured to receive a signal on the StateBitGlobal node and another input node of the plurality of input nodes may be coupled to the StateBitOffGlobalIF node on the inactive state information path 25b and configured to receive a signal on the StateBitOffGlobalIF node. The AND circuit 55 may further provide a logical product of the signal on the StateBitOffGlobal node and the signal on the StateBitOffGlobalIF node as an output signal. For example, the AND circuit 55 may provide an inactive state (e.g., a logic low level) at an output node responsive to the active state (e.g., a logic high level) of the StateBitGlobal signal and the negative pulse of the StateBitOffGlobalIF node at a transition of the StateBit signal of any die from the active state to the inactive state. The NOR circuit 52 may receive an active die identifier signal DieActive and the output signal of the AND circuit 55 and may further provide a logical NOR output. The logical NOR output in an active state may cause the transistor 54 to weakly pull down the StateBitGlobal node to the second voltage. Any transistor 53 in any die of the master die 13 and the slave dies 14 may set (e.g., pull up) the StateBitGlobal node of the active state information path 25a to the first voltage responsive to an active state of the die. Otherwise, the StateBitGlobal node may be weakly pulled down to the inactive state.

For example, the master inactive state information generator 29b may be the inactive state information generator 50b and the inactive state information generator 50b will not be repeated. Because the StateBitOffGlobalIF node in the inactive state information path 25b may be coupled to an input node of the AND circuit 55, negative one shot pulses caused by any of the transistors 59 having the strong driving ability to set the second voltage (e.g., pull down) in the master inactive state information generator 29b and the slave inactive state information generators 39b may be reflected on the StateBitOffGlobalIF node.

Figure 4D:
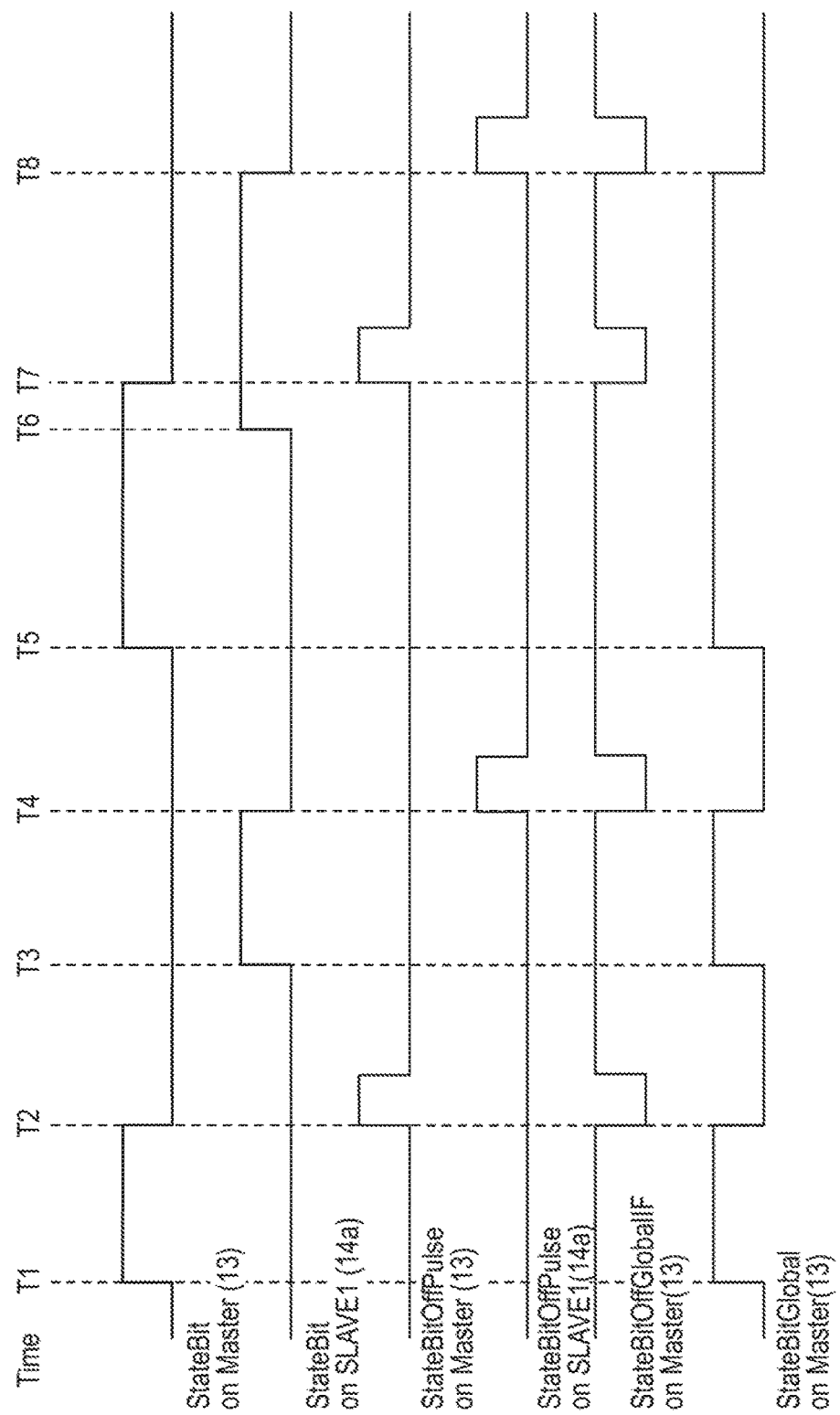
FIG. 4D is a timing diagram of signals of the active state information generators and the inactive state information generators in the plurality of dies, in accordance with an embodiment of the present disclosure.

FIG. 4D is a timing diagram of signals of the active state information generators and the inactive state information generators in the plurality of dies, in accordance with an embodiment of the present disclosure. As the StateBit signal on the master die 13 is activated at T1, the inverted StateBit signal provided to the NAND circuit 51 in the master active state information generator 29a which activates the transistor 53 to strongly set (e.g., pull up) the StateBitGlobal node to the first voltage, thus the StateBitGlobal node is activated. When the StateBit signal on the master die 13 transitions from an active state from an inactive state at T2, the transition of the StateBit signal causes the one shot pulse generator 57 in the master inactive state information generator 29b to provide a positive one shot pulse on the StateBitOffPulse signal. Responsive to the positive one shot pulse on the StateBitOffPulse signal, a negative one shot pulse may be provided on the StateBitOffGlobalIF node by the transistor 59 in the master inactive state information generator 29b. Due to the negative one shot pulse on the StateBitOffGlobalIF node, the StateBitGlobal node on the master die 13 is deactivated.

As the StateBit signal on the slave die 14 is activated at T3, the inverted StateBit signal provided to the NAND circuit 51 in the slave active state information generator 39a which activates the transistor 53 to strongly set (e.g., pull up) the StateBitGlobal node to the first voltage, thus the StateBitGlobal node on the master die 13 is activated. When the StateBit signal on the slave die 14 transitions from an active state from an inactive state at T4, the transition of the StateBit signal causes the one shot pulse generator 57 in the slave inactive state information generator 39b to provide a positive one shot pulse on the StateBitOffPulse signal. Responsive to the positive one shot pulse on the StateBitOffPulse signal, a negative one shot pulse may be provided on the StateBitOffGlobalIF node on the master die 13 by the transistor 59 in the slave inactive state information generator 39b. Due to the negative one shot pulse on the StateBitOffGlobalIF node, the StateBitGlobal node on the master die 13 is deactivated.

As the StateBit signal on the master die 13 is activated at T5, the StateBitGlobal node is activated. As the StateBit signal on the slave die 14 is activated at T6, the StateBitGlobal node maintains an active state. When the StateBit signal on the master die 13 transitions from an active state from an inactive state at T7, a positive one shot pulse is provided on the StateBitOffPulse signal on the master die 13 and a negative one shot pulse is provided on the StateBitOffGlobalIF node on the master die 13. However, the negative one shot pulse is provided on the StateBitOffGlobalIF node is reflected on the StateBitGlobal node via the transistor 54 with the weak driving ability to set the second voltage (e.g., pulling down) in the master active state information generator 29a on the master die 13, whereas the active StateBit signal on the slave die 14 is reflected on the StateBitGlobal node via the transistor 53 with the strong driving ability to set (e.g., pull up) the first voltage in the slave active state information generator 39a on the slave die 14, thus the StateBitGlobal node maintains the active state. When the StateBit signal on the slave die 14 transitions from the active state from the inactive state at T8, the transition of the StateBit signal causes the StateBitGlobal node on the master die 13 to be deactivated. Thus, the StateBitGlobal node may maintain an active state when one of the StateBit signals on the plurality of dies is active, regardless of another StateBit signal transitioning from the active state from the inactive state.

Logic levels of signals used in the embodiments described the above are merely examples. However, in other embodiments, combinations of the logic levels of signals other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:
1. An apparatus comprising:
a first die comprising a first command address decoder circuit, a first active state information generator and a first inactive state information generator;
a second die comprising a second command address decoder circuit, a second active state information generator and a second inactive state information generator;
an active state information path coupled to the first active state information generator and the second active state information generator; and an inactive state information path coupled to the first inactive state information generator and the second inactive state information generator, wherein the first active state information generator is configured to provide first active state information to the active state information path;

wherein the second active state information generator is configured to provide second active state information to the active state information path, wherein the first inactive state information generator is configured to provide first inactive state information to the inactive state information path, and wherein the second inactive state information generator is configured to provide second inactive state information to the inactive state information path.

2. The apparatus of claim 1, wherein the first die further comprises:
 a first through electrode coupled to the first active state information generator and the second active state information generator; and
 a second through electrode coupled to the first inactive state information generator and the second inactive state information generator.

3. The apparatus of claim 1, wherein the first active state information generator is configured to provide the first active state information responsive, at least in part, to a first state bit signal representing an active state of the first die,
 wherein the first inactive state information generator is configured to provide the first inactive state information responsive, at least in part, to the first state bit signal representing a transition of the first die from the active state to an inactive state,
 wherein the second active state information generator is configured to provide the second active state information responsive, at least in part, to a second state bit signal representing an active state of the second die, and
 wherein the second inactive state information generator is configured to provide the second inactive state information responsive, at least in part, to the second state bit signal representing a transition of the second die from the active state to an inactive state.

4. The apparatus of claim 3, wherein the first command address decoder circuit is configured to provide the first state bit signal responsive, at least in part, to a first command and first address information related to the first die, and
 wherein the second command address decoder circuit is configured to provide the second state bit signal responsive, at least in part, to a second command and second address information related to the second die.

5. An apparatus comprising:
 a plurality of slave dies, each of the slave dies including a command address decoder circuit, an inactive state information generator, and an active state information generator, and
 a master die including a command address decoder circuit, a master active state information generator coupled to each of the active state generators of the plurality of slave dies via an active state information path, and further including a master inactive state information generator coupled to each of the inactive state generators of the plurality of slave dies via an inactive state information path,
 wherein the master active state information generator is configured to provide active state information for the master die and the plurality of slave dies, and wherein the master inactive state information generator is configured to provide inactive state information for the master die and the plurality of slave dies.

6. The apparatus of claim 5, wherein each of the active state information generators and the master active state information generator is configured to provide an active signal when their respective die is in an active state as indicated by the respective command address decoder circuit, and
 wherein each of the inactive state generators and the master inactive state generator are configured to provide a pulse when their respective die transitions from the active state to an inactive state as indicated by the respective command address decoder unit.

7. The apparatus of claim 5, wherein each of the active state information generators is configured to provide a respective slave active state signal for their respective slave die,
 wherein the master active state information generator is further configured to provide a master active state signal for the master die, and
 wherein the master active state generator is further configured to provide a global active signal including a logical sum of each of the slave active state signals and the master active state signal.

8. The apparatus of claim 5, wherein each of the inactive state information generators is configured to provide a respective slave inactive state signal for their respective slave die,
 wherein the master inactive state information generator is further configured to provide a master inactive state signal for the master die, and
 wherein the master inactive state information generator is further configured to provide a global inactive state signal including a logical sum of each of the slave inactive state signals and the master inactive signal.

9. The apparatus of claim 5, wherein each of the plurality of slave dies is physically identical to the master die.

10. The apparatus of claim 5, wherein the active state information path and the inactive state information path each comprise a first and second through electrode in each of the plurality of slave dies and the master die, each of the first through electrodes coupled to the first through electrodes of adjacent dies, and each of the second through electrodes coupled to the second through electrodes of the adjacent dies.

11. The apparatus of claim 5, wherein each of the plurality of slave dies and the master die comprise a memory cell array.

12. The apparatus of claim 5, wherein each of the plurality of slave dies and the master die comprise a command address decoder circuit configured to transition the die to the active state in response a first command signal and to transition the die to the inactive state in response to a second command signal.

13. The apparatus of claim 5, wherein the master die further comprises one or more external terminals configured to receive external signals, and wherein the master die is configured to provide the external signals to the plurality of slave die.

14. A method comprising:
 generating, for each die of a memory device, an active state information signal comprising an active signal when the die is in an active state as indicated by a command address decoder circuit of each of the dies;
 generating, for each of the dies of the memory device, an inactive state information signal comprising a pulse whenever the die transitions to an inactive state as indicated by a command address decoder circuit of each of the dies;

generating, at one of the dies, a global active state information signal comprising an active signal when any of the dies is in the active state by combining the active state information signals; and generating, at one of the dies, a global inactive state information signal comprising a pulse whenever any of the dies transitions from the active state to the inactive state by combining the inactive state information signals.

15. The method of claim 14, further comprising:

providing a stack of memory dies;

configuring one of the dies as a master die, wherein the master die is configured to provide the global active state information signal and the global inactive state information signal; and configuring the remaining dies as a plurality of slave dies.

16. The method of claim 15, wherein the configuring one of the dies as the master die and the configuring the remaining dies as a plurality of slave dies comprises assigning a unique identifier to each of the plurality of slave dies and to the master die.

17. The method of claim 15, wherein the configuring one of the dies as the master die comprises configuring an active state generator of the master die as a master active state generator and configuring an inactive state generator of the master die as a master inactive state generator.

18. The method of claim 17, further comprising receiving the active state information signals and the inactive state information signals at the master die, and providing the global active state information signal with the master active state information generator and providing the global inactive state information signal with the master inactive state information generator.

19. The method of claim 15, further comprising generating, at the master die, a clock signal when the master die is in an active state and when the master die is in an inactive state.

20. The method of claim 14, further comprising providing an active die identifier signal and transitioning one or more of the dies to the active state in response to the active die identifier signal.

* * * * *